United States Patent
Miyashita

(10) Patent No.: US 8,494,069 B2
(45) Date of Patent: Jul. 23, 2013

(54) PHASE CORRECTING APPARATUS AND DISTORTION COMPENSATING APPARATUS FOR RADIO TRANSMITTER

(75) Inventor: Takumi Miyashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 399 days.

(21) Appl. No.: 12/721,138

(22) Filed: Mar. 10, 2010

(65) Prior Publication Data

US 2010/0232481 A1    Sep. 16, 2010

(30) Foreign Application Priority Data

Mar. 12, 2009 (JP) .................................. 2009-059179

(51) Int. Cl.
- *H04L 5/12* (2006.01)
- *H04L 5/16* (2006.01)
- *G01C 19/22* (2006.01)

(52) U.S. Cl.
USPC ........................... 375/261; 375/222; 356/464

(58) Field of Classification Search
USPC ................... 375/222, 261; 356/464
See application file for complete search history.

(56) References Cited

U.S. PATENT DOCUMENTS

| | | | |
|---|---|---|---|
| 5,802,451 A | | 9/1998 | Adachi et al. |
| 6,320,664 B1 * | | 11/2001 | Kaliszek et al. ............... 356/464 |
| 6,329,929 B1 * | | 12/2001 | Weijand et al. ........... 340/870.25 |
| 6,466,394 B1 * | | 10/2002 | Saito et al. .................. 360/77.08 |
| 6,487,236 B1 * | | 11/2002 | Iwamatsu et al. .............. 375/148 |
| 6,560,294 B1 * | | 5/2003 | Gatherer ........................ 375/261 |
| 6,560,449 B1 * | | 5/2003 | Liu ................................ 455/302 |
| 6,940,916 B1 | | 9/2005 | Warner et al. |
| 2001/0028679 A1 * | | 10/2001 | Chou ............................. 375/226 |
| 2002/0037032 A1 * | | 3/2002 | Nakamura et al. ............. 375/222 |
| 2002/0097811 A1 * | | 7/2002 | Kubo et al. .................... 375/296 |
| 2005/0073361 A1 * | | 4/2005 | Hamada et al. ................ 330/149 |
| 2005/0078768 A1 | | 4/2005 | Sun et al. |
| 2006/0079290 A1 * | | 4/2006 | Seto et al. .................. 455/562.1 |

FOREIGN PATENT DOCUMENTS

| | | |
|---|---|---|
| JP | 11-127206 | 5/1999 |
| JP | 2007-28473 | 2/2007 |
| WO | 03/103166 | 12/2003 |

OTHER PUBLICATIONS

Notification of Reason for Refusal dated Nov. 20, 2012, from corresponding Japanese Application No. 2009-059179.

Joel L. Dawson, et al. "Automatic Phase Alignment for a Fully Integrated CMOS Cartesian Feedback Power Amplifier System" ISSCC 2003, Session 15, Cellular Communications, Paper 15.1, 2003.

(Continued)

*Primary Examiner* — Leon-Viet Nguyen
*Assistant Examiner* — Sarah Hassan
(74) *Attorney, Agent, or Firm* — Katten Muchin Rosenman LLP

(57) ABSTRACT

A phase correcting apparatus, for a radio transmitter which obtains a first radio signal (RS1) based on a first baseband signal (BB1), includes a demodulator which demodulates a feedback signal from which a part of RS1 is extracted by a first carrier signal (CS1) and which generates a second baseband signal (BB2), a modulator which modulates a difference signal between BB1 and BB2 by a second carrier signal (CS2) and which outputs a second radio signal (RS2), a power amplifier which amplifies RS2 to obtain RS1, a detector which detects a phase difference between BB1 and BB2, and a phase rotator which rotates any phase of BB1, BB2, CS1, or CS2 as a target phase correction amount, wherein the detector converts a desired analog signal obtained by multiplying BB1 and BB2 into a digital signal, and which detects the phase difference based on digital data.

4 Claims, 8 Drawing Sheets

OTHER PUBLICATIONS

Joel L. Dawson, et al. "Automatic Phase Alignment for a Fully Integrated Cartesian Feedback Power Amplifier System" IEEE Journal of Solid-State Circuits, Vol .38, No. 12, Dec. 2003.

Joel L. Dawson, et al. "Automatic Phase Alignment for High Bandwidth Cartesian Feedback Power Amplifiers" IEEE 2000, Downloaded Oct. 28, 2008.

Extended European Search Report dated Oct. 7, 2011, from corresponding European Application No. 10 156 110.8.

Partial European Search Report dated Jun. 29, 2011, from corresponding European Application No. 10 15 6110.

Joel L. Dawson, et al. "Automatic Phase Alignment for a Fully Integrated Cartesian Feedback Power Amplifier System" IEEE Journal of Solid-State Circuits, vol. 38, No. 12, Dec. 2003.

\* cited by examiner

PHASE CORRECTING APPARATUS AND DISTORTION COMPENSATING APPARATUS FOR RADIO TRANSMITTER

CROSS-REFERENCE TO RELATED APPLICATIONS

This application is based upon and claims the benefit of priority of the prior Japanese Patent Application No. 2009-59179, filed on Mar. 12, 2009, the entire contents of which are incorporated herein by reference.

FIELD

The embodiments discussed herein are related to a phase correcting apparatus for a radio transmitter and a distortion compensating apparatus for a radio transmitter.

BACKGROUND

In general, a linearity of an output signal from a power amplifier for radio transmission is limited, and gain reduction (linearity distortion) occurs especially when a level of an input signal is high. As a circuit for compensating the above-described linearity distortion, a Cartesian Feedback distortion compensating apparatus has been known. If the Cartesian Feedback distortion compensating apparatus operates ideally, the output signal of the power amplifier may have a high linearity.

In the Cartesian Feedback distortion compensating apparatus, the output signal of the power amplifier is extracted and then fed back to the input side. At this time, a phase change of a feedback system is produced due to influence by, for example, an antenna load, a transmission delay of a directional coupler or a demodulator, or the like. Therefore, to operate the Cartesian Feedback distortion compensating apparatus effectively, the phase change of the feedback system is required to be compensated.

To solve the above-described problem, Non-Patent Documents 1 (Joel L. Dawson, Thomas H. Lee, "Automatic Phase Alignment for a Fully Integrated CMOS Cartesian Feedback Power Amplifier System ISSCC2003") and 2 (Joel L. Dawson, Thomas H. Lee, "Automatic Phase Alignment for a Fully Integrated Cartesian Feedback Power Amplifier System", IEEE JOURNAL OF SOLID-STATE CIRCUIT, Vol. 38, No. 12, December 2003) have disclosed a phase correcting apparatus that is applied to the Cartesian Feedback distortion compensating apparatus. FIG. 1 illustrates a main part of this phase correcting apparatus.

With reference to FIG. 1, description will be made below of the conventional phase correcting apparatus. The phase correcting apparatus illustrated in FIG. 1 includes a power amplifier 2, a directional coupler 3, a local oscillator 4, an orthogonal demodulator 5, a phase difference detector 6, a phase rotator 7, and an orthogonal modulator 8. In the phase correcting apparatus illustrated in FIG. 1, an output signal (an RF signal) of the power amplifier 2 is extracted (is fed back) by the directional coupler 3, and the orthogonal demodulator 5 generates a baseband signal (a complex signal of I' and Q'). The phase difference detector 6 detects a phase difference between the baseband signal (the complex signal of I and Q) that is to be input to the phase rotator 7 and the baseband signal (the complex signal of I' and Q') that is to be output from the orthogonal demodulator 5, and then gives the phase difference as a target phase compensation amount to the phase rotator 7. The phase rotator 7 rotates the baseband signal (the complex signal of I and Q) only by the given target phase compensation amount.

In this case, the phase difference detector 6 detects the phase difference as follows. If the amplitude and the phase on an I-Q plane of the baseband signal (I, Q) are r and $\theta$, respectively, and if the amplitude and the phase on the I-Q plane of the baseband signal (I', Q') are r' and $\theta'$, the phase difference detector 6 performs calculation using the following formula.

$$\Delta\theta = G(IQ' - QI') = -Grr'\sin(\theta - \theta')$$

The phase difference detector 6 integrates $d\theta/dt$ in the above-described formula to calculate $\theta$ (the target phase compensation amount). The phase rotator 7 performs phase rotation only on the $\theta$ calculated by the phase difference detector 6 with respect to the baseband signal (I, Q). In the phase difference detector 6, the $\theta$ is not necessary to be given to the phase rotator 7, and the trigonometric function (sin $\theta$, cos $\theta$) may be given. According to the above-described configuration, the phase correcting apparatus illustrated in FIG. 1 compensates a phase change in a feedback system.

The conventional phase correcting apparatus has been basically designed with an analog circuit. In this case, especially the phase difference detector that detects the target phase compensation amount requires a highly accurate circuit. However, design of the circuit corresponding to signals in a wide range is difficult.

SUMMARY

According to a certain aspect of the invention, a phase correcting apparatus, for a radio transmitter which obtains a first radio signal based on a first baseband signal, includes a demodulator which demodulates a feedback signal from which a part of the first radio signal is extracted by a first carrier wave signal and which generates a second baseband signal, a modulator which modulates a difference signal between the first baseband signal and the second baseband signal by a second carrier wave signal and which outputs a second radio signal, a power amplifier which amplifies the second radio signal to obtain the first radio signal, a phase difference detector which detects a phase difference between the first baseband signal and the second baseband signal, and a phase rotator which rotates any phase of the first baseband signal, the second baseband signal, the first carrier wave signal, or the second carrier wave signal as a target phase correction amount, wherein the phase difference detector converts a desired analog signal which is obtained by multiplying the first baseband signal and the second baseband signal into a digital signal, and which detects the phase difference based on digital data.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DETAILED DESCRIPTION OF THE PREFERRED EMBODIMENTS

Detailed description will be made below of embodiments of the present invention. In the following embodiment, description will be made especially of a Cartesian Feedback distortion compensating apparatus (hereinafter referred to as distortion compensating apparatus) and a phase correcting apparatus that is applied to this distortion compensating apparatus.

(1) Configuration of Distortion Compensating Apparatus

Figure 1:
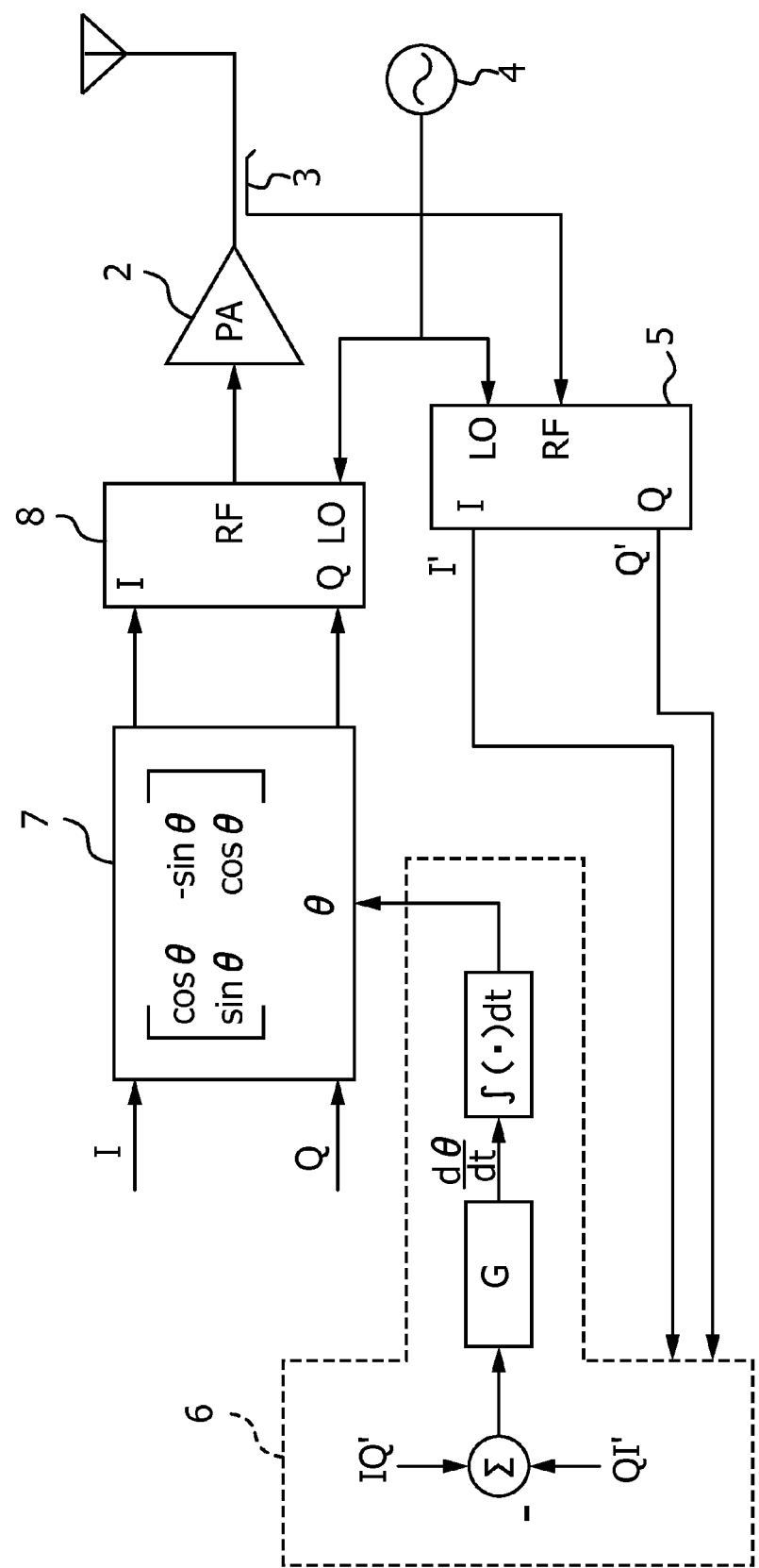
FIG. 1 illustrates a block diagram of a phase correcting apparatus of related art.
Figure 2:
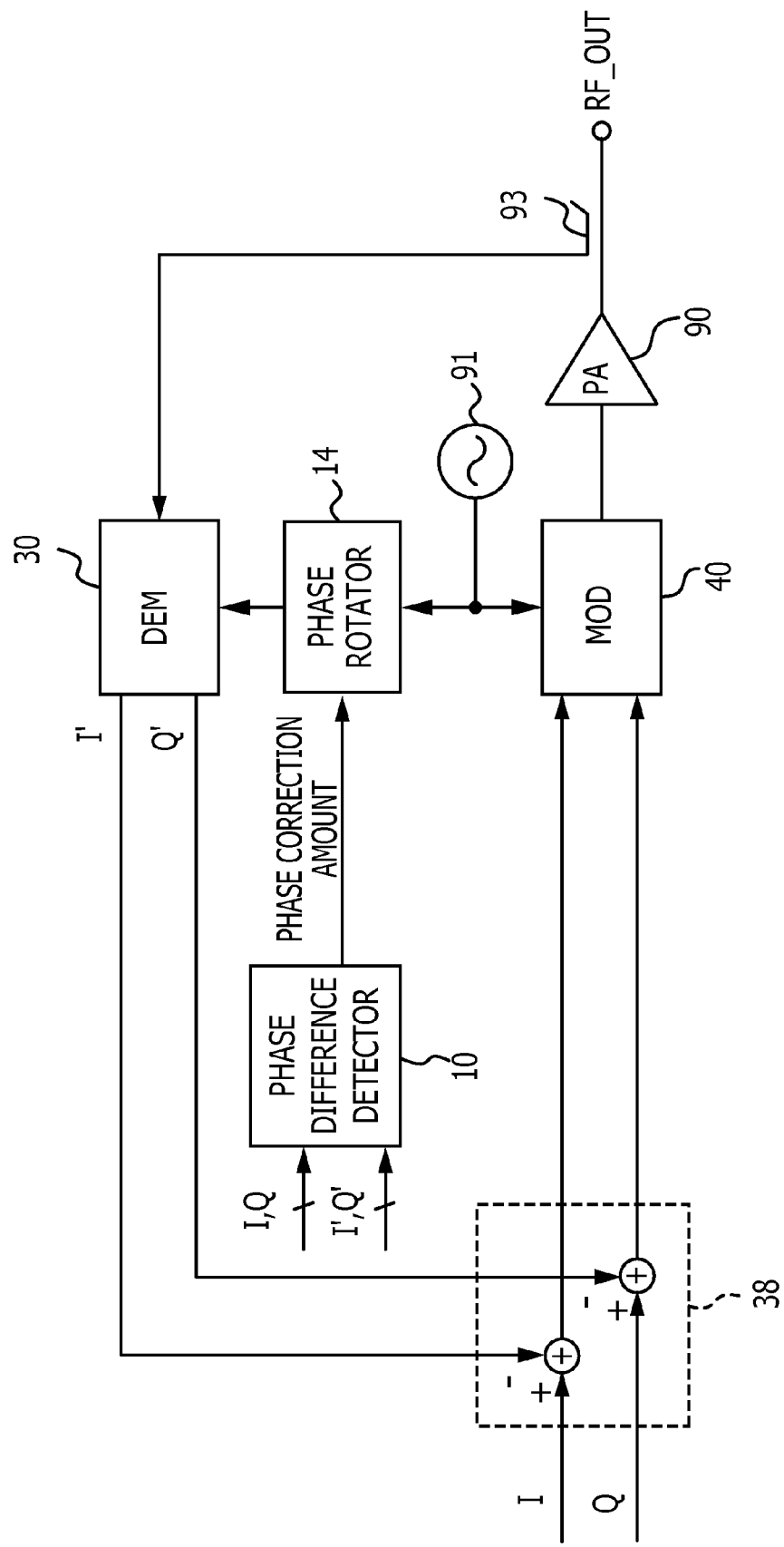
FIG. 2 illustrates an example of a block diagram of a phase correcting apparatus of an embodiment.

With reference to FIG. 2, description will be made below of a configuration of a distortion compensating apparatus according to the present embodiment. FIG. 2 is a block diagram illustrating the configuration of a part of the distortion compensating apparatus according to the present embodiment. The phase correcting apparatus illustrated in FIG. 2 includes a phase difference detector 10, a phase rotator 14, an orthogonal demodulator (DEM) 30, a subtractor 38, an orthogonal modulator (MOD) 40, a power amplifier (PA) 90, a local oscillator 91, and a directional coupler 93. The phase correcting apparatus according to the present embodiment is made up of the phase difference detector 10 and the phase rotator 14. In FIG. 2, a carrier wave signal generated by the local oscillator 91 is sent to the orthogonal modulator 40. The carrier wave signal generated by the local oscillator 91 is sent to the orthogonal demodulator 30 after being phase-rotated by the phase rotator 14.

In the distortion compensating apparatus illustrated in FIG. 2, an output RF signal (RF_OUT) of the power amplifier 90 is extracted by the directional coupler 93, and then a baseband signal (a complex signal of I' and Q') is generated by the orthogonal demodulator 30. This baseband signal (the complex signal of I' and Q') is fed back to the subtractor 38. Accordingly, a Cartesian Feedback circuit is formed. The baseband signal (the complex signal of I' and Q') that is to be fed back is input to the phase difference detector 10 with a baseband signal (the complex signal of I and Q) that is to be input.

In a radio transmitter according to the present embodiment, the phase difference detector 10 detects a phase difference based on the baseband signal (the complex signal of I and Q) that is to be input and the baseband signal (the complex signal of I' and Q') that is to be fed back, and then sends the detected phase difference as a target phase compensation amount to the phase rotator 14. As described below, the phase difference detector 10 includes an Analog/Digital (A/D) converter that detects a phase difference by digital processing. The detection principal of the phase difference is the same as disclosed in Non-Patent Document 1. The phase rotator 14 rotates the carrier wave signal, which is to be sent to the orthogonal demodulator 30 from the local oscillator 91, only by the target phase compensation amount that is sent from the phase difference detector 10. Consequently, the phase change produced in the feedback system is compensated, so that the Cartesian Feedback distortion compensating apparatus operates effectively.

Figure 3:
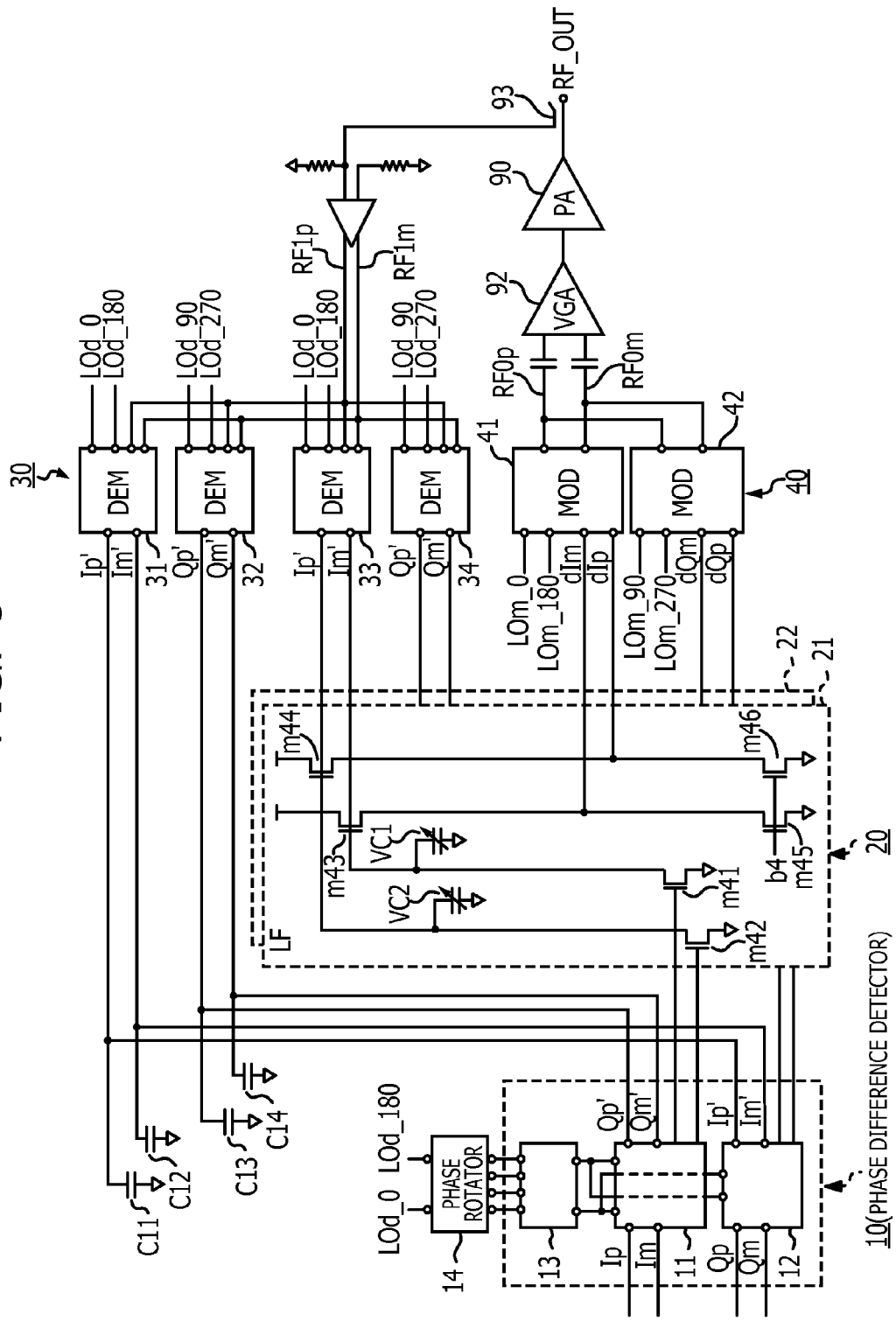
FIG. 3 illustrates an example of a block diagram of a phase correcting apparatus when the phase correcting apparatus is configured with CMOS.

(2) Configuration Example of the Distortion Compensating Apparatus Having Cmos Configuration Next, with reference to FIG. 3, description will be made of a distortion compensating apparatus having a CMOS configuration. FIG. 3 is a block diagram illustrating a configuration in a case where the distortion compensating apparatus with respect to the Cartesian Feedback distortion compensating apparatus according to the embodiment has the CMOS configuration. In FIG. 3, the same parts are indicated with the same numerals as in FIG. 2.

In FIG. 3, differential signals (signals whose phase is inverted) of an I signal (baseband signal) to be put to the phase difference detector 10 are indicated as Ip and Im. The differential signals of a Q signal (baseband signal) are indicated as Qp and Qm. The differential signal of an I' signal (baseband signal) to be fed back to the phase difference detector 10 are indicated as Ip' and Im'. The differential signals of a Q' signal are indicated as Qp' and Qm'. As for all the signals in the following description, a signal added with p indicates a positive phase signal, and a signal added with m indicates an antiphase signal.

In FIG. 3, as for the carrier wave signals to be input to the orthogonal modulator 40, the signals that are phase-rotated by 90 degrees are indicated as LOm_0, LOm_90, LOm_180, and LOm_270, respectively. The orthogonal modulator 40 includes an orthogonal modulator 41 for orthogonal modulation of an I component and an orthogonal modulator 42 for orthogonal modulation of a Q component. The distortion compensating apparatus is operated by the differential signal. Therefore, signals LOm_0, and LOm_180 are used in the orthogonal modulator 41, and the signals LOm_90, and LOm_270 are used in the orthogonal modulator 42. The signals dIp and dIm are input as a difference signal of the I component to the orthogonal modulator 41, and the signals dQp and dQm are input as a difference signal of the Q component to the orthogonal modulator 42. The output signals of the orthogonal modulator 41 and the orthogonal modulator 42 are combined, and then differential signals RF0p, RF0m at an RF level are obtained. The RF differential signals are amplified up to a desired level by a Variable Gain Amplifier (VGA) 92 and the power amplifier 90, and then an output signal RF_OUT is obtained.

In FIG. 3, some of the output signals RF_OUT (single-ended output) of the power amplifier 90 are extracted by the directional coupler 93 and then converted into RF differential signals RF1p and RF1m. The RF differential signals RF1p and RF1m are input to the orthogonal demodulator 30.

In FIG. 3, as for the carrier wave signal to be input to the orthogonal demodulator 30, the signals whose phases are shifted by 0, 90, 180, and 270 degrees are indicated as signals LOd_0, LOd_90, LOd_180, and LOd_270. The orthogonal demodulator 30 includes orthogonal demodulators 31 and 33 performing orthogonal demodulation of the I component and orthogonal demodulators 32 and 34 performing the orthogonal demodulation of the Q component. The orthogonal demodulators 31 and 33 have the same configuration. The orthogonal demodulators 32 and 34 have the same configuration. Each of the orthogonal demodulators 33 and 34 demodulates the RF signal (the differential signals RF1p and RF1m) extracted from the power amplifier 90 and feeds back the obtained baseband signal to the input side. On the other hand, each of the orthogonal demodulators 31 and 32 demodulates the RF signal (the differential signals RF1p and RF1m) extracted from the power amplifier 90, and is provided to send the obtained baseband signal to the phase difference detector 10. The orthogonal demodulators 31 and 33 and the orthogonal demodulators 32 and 34 are provided separately.

This is because the filter characteristics are separately adjustable by feedback to the input side and the feedback to the phase difference detector 10. This point will be described below. This distortion compensating apparatus is operated by the differential signal. Therefore, the signals LOd_0 and LOd_180 are used in the orthogonal demodulators 31 and 33, and the signals LOd_90 and LOd_270 are used in the orthogonal demodulators 32 and 34. These signals LOd_0, LOd_90, LOd_180, and LOd_270 are carrier wave signals generated by the phase rotator 14 by phase-rotating the signals LOm_0, LOm_90, LOm_180, and LOm_270.

The low-pass filter unit 20 includes a low-pass filter unit 21 for processing the I component and a low-pass filter unit 22 for processing the Q component. The low-pass filter unit 21 subtracts the I component (Ip', Im') of the baseband signal that is output from the orthogonal demodulator 33 from the I component (Ip, Im) of the baseband signal that is input. In the same way, the low-pass filter unit 22 subtracts the Q component (Qp', Qm') of the baseband signal that is output from the orthogonal demodulator 34 from the Q component (Qp, Qm) of the baseband signal that is input. The above-described subtraction processing corresponds to functions of the subtracter 38 illustrated in FIG. 2. Differential signals dIp and dIm (the difference signals) of the I component obtained by the subtraction processing by the low-pass filter unit 21 are input to the orthogonal modulator 41. The differential signals dQp and dQm (the difference signal) of the Q component obtained by the subtraction processing by the low-pass filter unit 22 are input to the orthogonal modulator 42. Accordingly, the Cartesian Feedback circuit is formed. Description will be made below of configurations of the low-pass filter units 21 and 22.

In FIG. 3, the phase correcting apparatus according to the present embodiment is made up of the phase difference detector 10 and the phase rotator 14. The phase difference detector 10 includes a first analog processing unit 11, a second analog processing unit 12, and a digital processing unit 13. Description will be made below of a specific configuration example of the phase difference detector 10.

(3) Entire Configuration Example of the Phase Difference Detector 10

Figure 4:
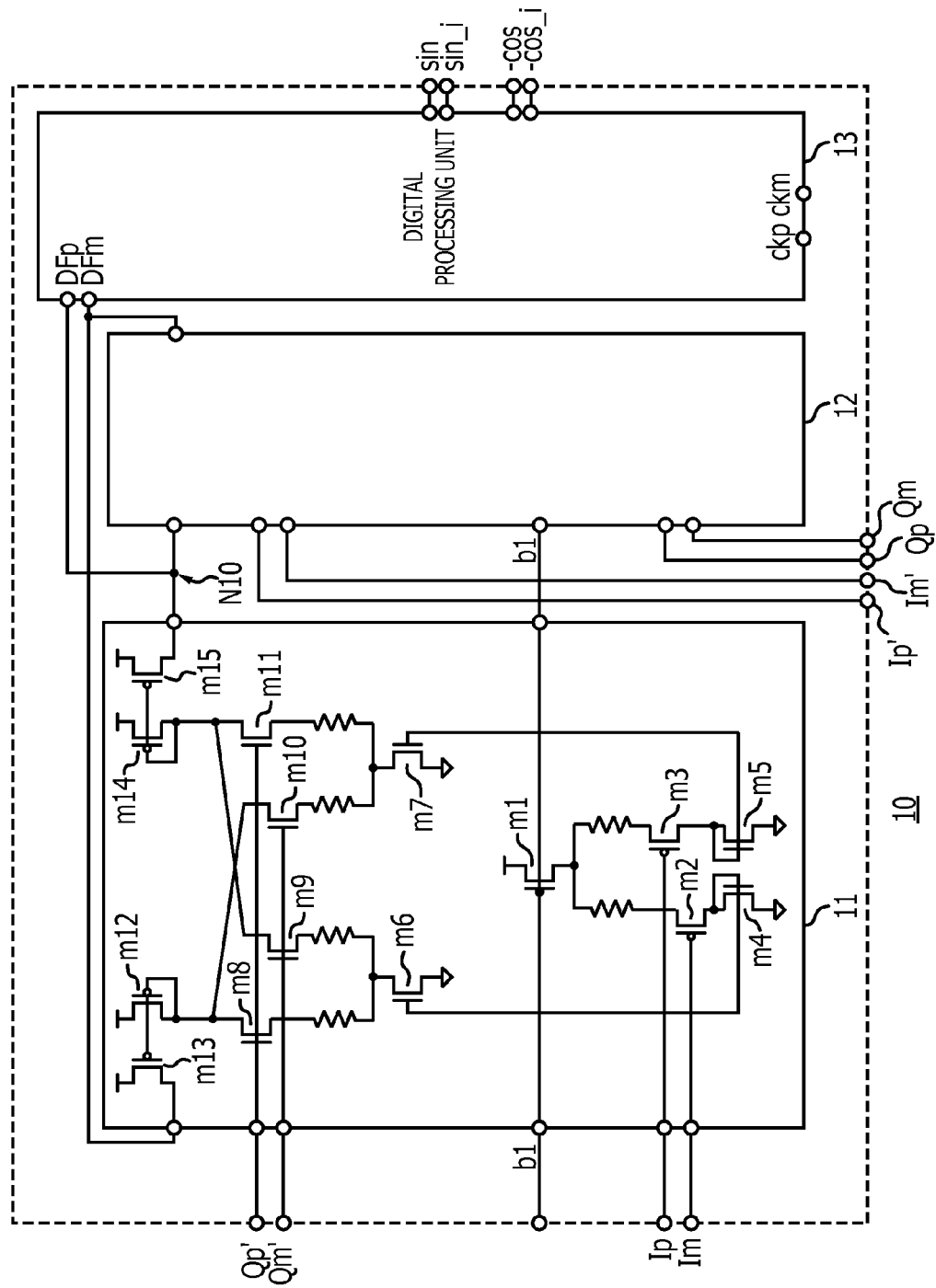
FIG. 4 illustrates an example of a phase difference detector of a phase correcting apparatus.

FIG. 4 illustrates an entire configuration example of the phase difference detector 10. In the phase difference detector 10, the first analog processing unit 11 performs analog multiplication (I×Q') of the I signal (the differential signals Ip and Im) to be input and of the Q' signal (the differential signal Qp' and Qm') to be fed back. The second analog processing unit 12 performs analog multiplication (Q×I') of the I' signal (the differential signals Ip' and Im') to be fed back and of the Q signal (the differential signals Qp and Qm) to be input. Based on the difference of the output of the first analog processing unit 11 and the second analog processing unit 12, that is, the differential signal of (Q×I'−I×Q'), the digital processing unit 13 calculates a sine value and a cosine value of the phase difference (target phase correcting amount) on the I-Q plane between the baseband signal to be input and the baseband signal to be fed back. The sine value and the cosine value are used for phase rotating processing in the phase rotator 14.

FIG. 4 illustrates an example of a case where the first analog processing unit 11 is configured with a Gilbert cell type analog multiplication circuit. In the first analog processing unit 11, the signals Ip and Im are respectively input to gate terminals of PMOS transistors m2 and m3 forming a differential pair. Source terminals of the PMOS transistors m2 and m3 are biased by a bias voltage b1 that is applied to the gate terminal of a PMOS transistor m1.

A drain terminal of the PMOS transistor m2 and the drain terminal of an NMOS transistor m4 are connected with each other. The drain terminal of the PMOS transistor m3 and the drain terminal of an NMOS transistor m5 are connected with each other. The drain terminal of the NMOS transistor m4 is connected to the gate terminal of the NMOS transistor m4 and then connected to the gate terminal of an NMOS transistor m6. In the same way, the drain terminal of the NMOS transistor m5 is connected to the gate terminal of the NMOS transistor m5 and then connected to the gate terminal of an NMOS transistor m7. That is, the NMOS transistor m4 and the NMOS transistor m6 configure a current mirror circuit, and the NMOS transistor m5 and the NMOS transistor m7 configure another current mirror circuit. Accordingly, the voltages of the signals Ip and Im applied to the gate terminal of the PMOS transistors m2 and m3 are converted into currents flowing the NMOS transistors m6 and m7.

In the first analog processing unit 11, NMOS transistors m8 and m9 form a differential pair, and NMOS transistors m10 and m11 form another differential pair. The signal Qp' is input to the gate terminal of the NMOS transistors m8 and m11. The signal Qm' is input to the gate terminal of the NMOS transistors m9 and m10. Therefore, in the NMOS transistors m8 to m11, the current generated based on the input of the signals Ip and Im is mixed with the current generated based on the input of the signals Qp' and Qm' (mixed current).

In the first analog processing unit 11, PMOS transistors m12 and m14 form a differential pair. The drain terminal of the PMOS transistor m12 is connected to the drain terminals of the NMOS transistors m8 and m10. The drain terminal of the PMOS transistor m14 is connected to the drain terminal of the NMOS transistors m9 and m11. Therefore, the above-described mixed current is differentially input to the PMOS transistors m12 and m14. The PMOS transistors m12 and m13 configure a current mirror circuit. The PMOS transistors m14 and m15 configure another current mirror circuit. The above-described mixed current is output from the drain terminals of the PMOS transistors m13 and m15.

The second analog processing unit 12 may have the same configuration as that of the above-described first analog processing unit 11. In a node N10 illustrated in FIG. 4, the output current of the first analog processing unit 11 is subtracted from the output current of the second analog processing unit 12. Then the difference current is input to the digital processing unit 13. That is, signals DFp and DFm corresponding to (Q×I'−I×Q') are input to the digital processing unit 13.

(4) Configuration Example of the Digital Processing Unit 13

Figure 5:
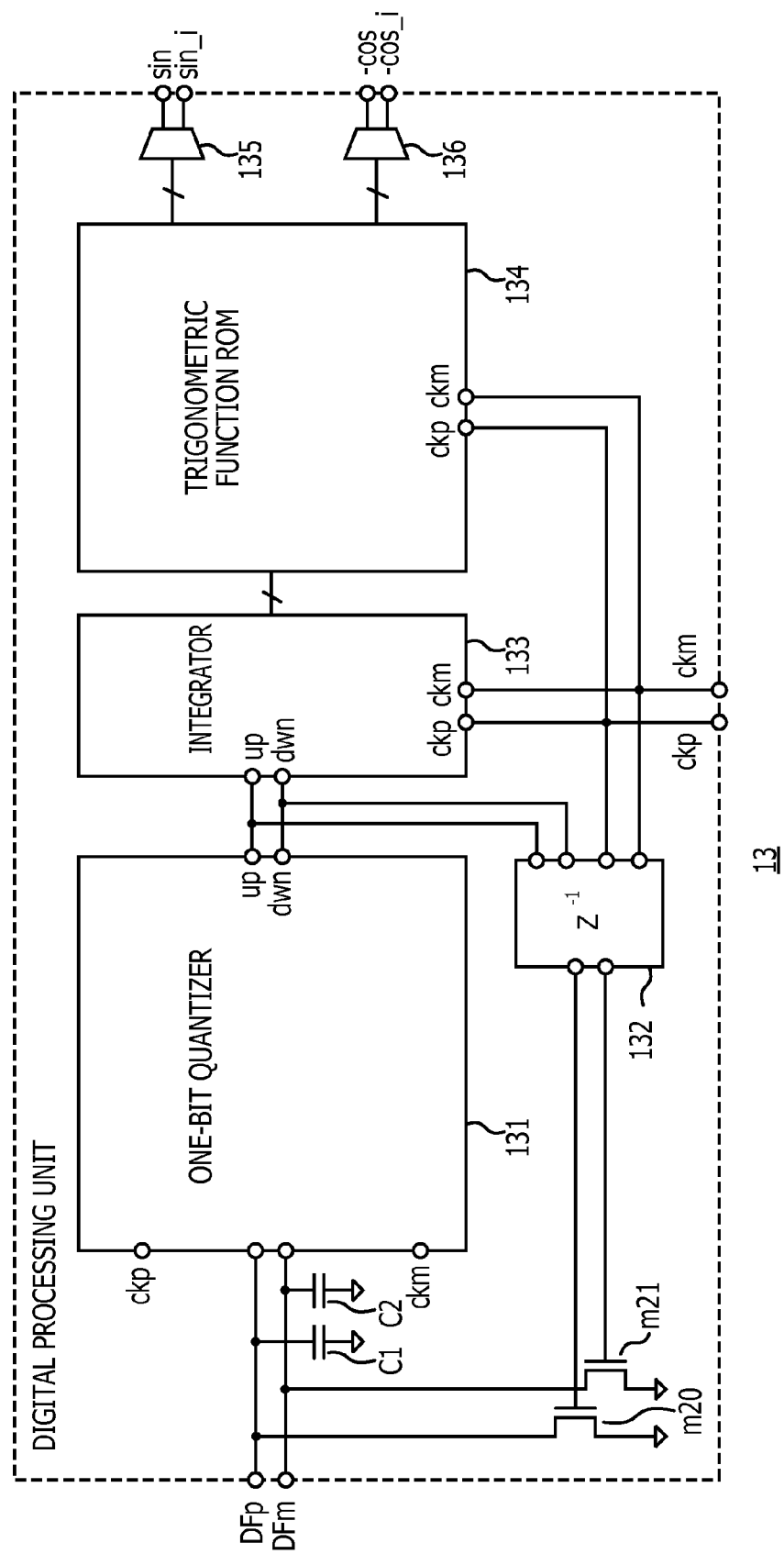
FIG. 5 illustrates an example of a configuration of a digital processing unit.
Figure 6:
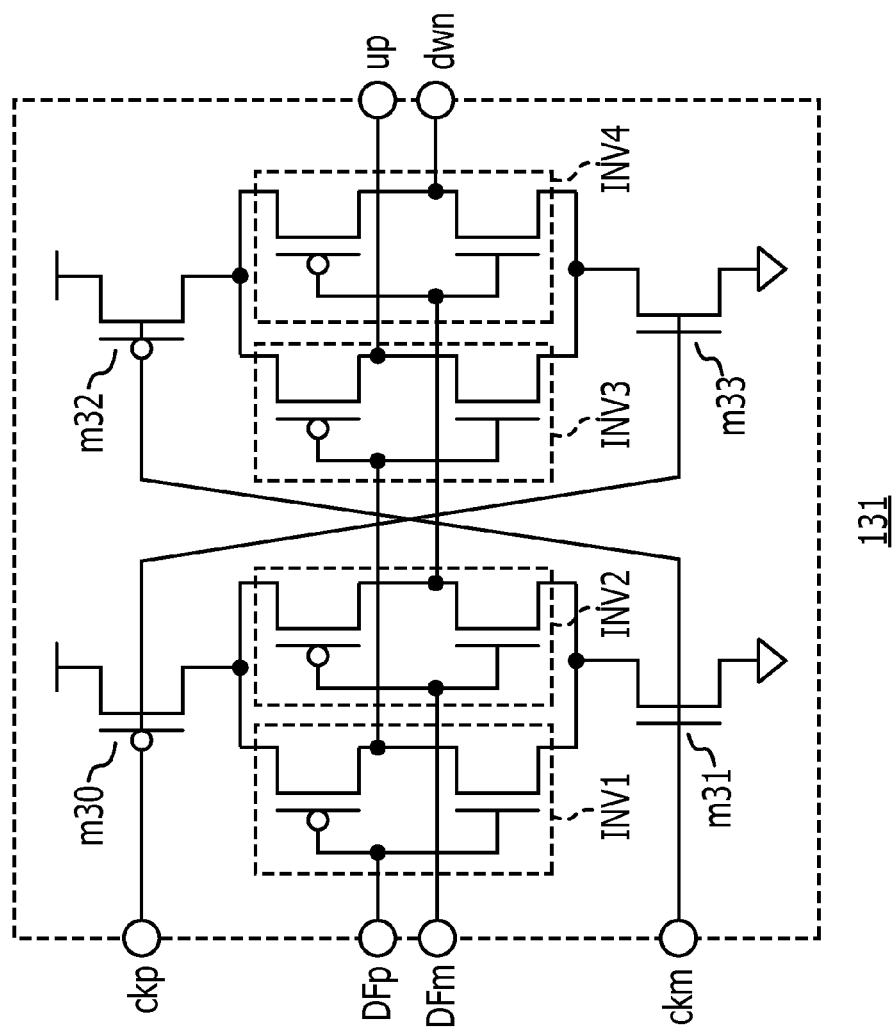
FIG. 6 illustrates an example of a circuit of a one-bit quantizer.

Next, with reference to FIG. 5 and FIG. 6, description will be made of a configuration example of the digital processing unit 13. FIG. 5 is a block diagram illustrating a configuration example of the digital processing unit 13. FIG. 6 is a circuit diagram illustrating a configuration example of a one-bit quantizer.

As illustrated in FIG. 5, the digital processing unit 13 mainly includes integral capacitors C1 and C2, a one-bit quantizer 131, a delay device 132, an integrator 133, a trigonometric function ROM 134, and D/A converters 135 and 136. In FIG. 5 and FIG. 6, signals "ckp" and "ckm" (the signal "ckm" is an inverted signal of the signal "ckp") are clock signals for operating the digital processing unit 13. In the digital processing unit 13, a one-bit sigma-delta type A/D converter is made up of the one-bit quantizer 131, the delay device 132, NMOS transistors m20 and m21, and the integral capacitors C1 and C2.

The current input by difference signals DFp and DFm with respect to the digital processing unit 13 is stored in the integral capacitors C1 and C2, and the voltage of the integral capacitors C1 and C2 is input to the one-bit quantizer 131.

The one-bit quantizer 131 illustrated in FIG. 6 is made up of two D latch circuits that process the difference signals DFp and DFm, respectively. In FIG. 6, a PMOS transistor m30 and an NMOS transistor m33 are turned on or off at the same time according to the level of the clock signal ckp. A PMOS transistor m32 and an NMOS transistor m31 are turned on or off at the same time according to a level of the clock signal ckm. A period in which the PMOS transistor m30 and the NMOS transistor m33 are turned on and a period in which the PMOS transistor m32 and the NMOS transistor m31 are turned on are synchronized with each other and alternately produced.

The one-bit quantizer 131 includes four inverters INV 1 to 4. Each of the inverters is made up of a pair of the PMOS transistor and the NMOS transistor connecting the gate terminal to the drain terminal thereof. The inverter INV1 that inputs the signal DFp and the inverter INV2 to that inputs the signal DFm are connected in parallel between the drain terminal of the PMOS transistor m30 and the drain terminal of the NMOS transistor m31. The inverter INV1 is connected to the inverter INV3. The inverter INV2 is connected to the inverter INV4. The inverter INV3 and the inverter INV4 are connected in parallel between the drain terminal of the PMOS transistor m32 and the drain terminal of the NMOS transistor m33.

In the one-bit quantizer 131, by operations of the MOS transistors m30 to m33, signals (up, dwn) of the output terminal are delayed by one clock and then output with respect to the input signals (DFp, DFm). In this case, if the signal level of the signal DFp is higher than that of the signal DFm, a logic level of the output terminal up is high. On the other hand, if the signal level of the signal DFm is higher than that of the signal DFp, the logic level of the output terminal dwn is high. That is, in the one-bit quantizer 131 illustrated in FIG. 6, the logic level of the output terminal up is high when the sign for (Q×I'−I×Q') is plus, and the logic level of the output terminal dwn is high when the sign is minus.

FIG. 5 will be described below. The signals of the output terminal up and the output terminal dwn of the one-bit quantizer 131 are delayed by one clock by the delay device 132. At this time, the delay device 132 generates an RZ signal by performing AND operation (logical operation) of the output signals of the one-bit quantizer 131. Then the RZ signal is applied to the gate terminal of the NMOS transistors m20 and m21. As a result, the input signal (DFp or DFm) corresponding to a signal at a higher level among the signals of the output terminal up and the output terminal dwn is grounded.

The integrator 133 (counter) is operated by the clock signals ckp and ckm. The integrator 133 counts up every time when the logic level of the output terminal up of the one-bit quantizer 131 becomes high. The integrator 133 counts down every time when the logic level of the output terminal dwn of the one-bit quantizer 131 becomes high. The output bit of the integrator 133 is, for example, 8 bits. However, the output is not limited to this example. The count value of the integrator 133 corresponds to a phase difference (a target phase correction amount).

The trigonometric function ROM 134 (memory) is operated by the clock signals ckp and ckm and stores digital data of the digital count value that may be given from the integrator 133 and of the trigonometric function (in this case, the value of sin and the value of −cos) with, for example, the 8-bit value as an address. When the count value of the integrator 133 is input to the trigonometric function ROM 134, the trigonometric function with the count value as the address is read out. The output bit of the trigonometric function ROM 134 is, for example, 6 bits. However, the output bit of the trigonometric function ROM 134 is not limited to this example.

The D/A converter 135 performs D/A conversion on, for example, a six-bit sine value that is output from the trigonometric function ROM 134 and generates an analog signal sin and an analog inverted signal sin_i of the signal sin. In the same way, the D/A converter 136 performs the D/A conversion on, for example, a six-bit cosine value that is output from the trigonometric function ROM 134 and generates −cos as an analog signal and an analog inverted signal −cos_i of the signal −cos.

(5) Configuration Example of the Phase Rotator 14

Figure 7:
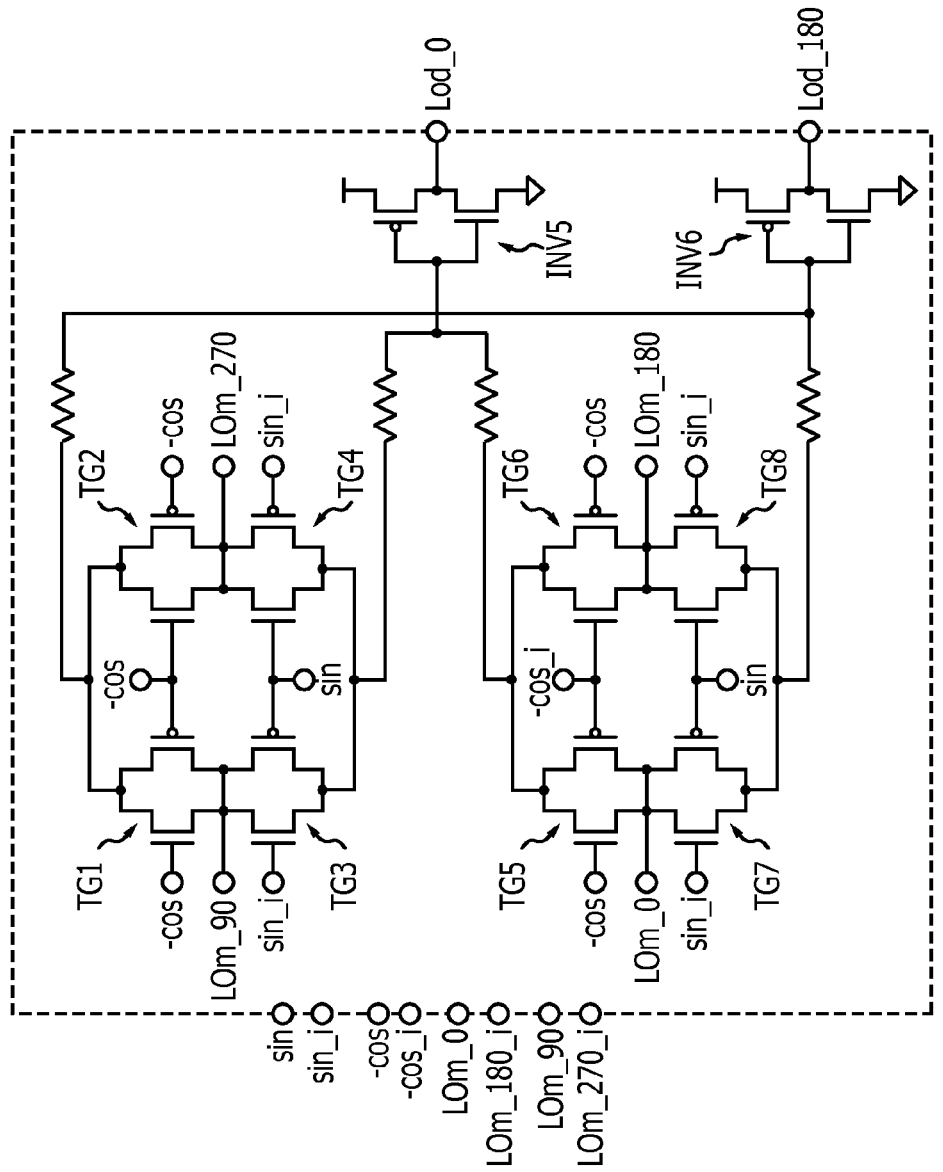
FIG. 7 illustrates an example of a circuit of phase rotator.

As the phase rotator 14 included in the phase correcting apparatus according to the present embodiment, a circuit is illustrated as an example in FIG. 7. In this circuit, two ring modulators are made up of transfer gates TG1 to TG8, and the inverters INV5 and INV6 output the carrier wave signals LOd_0 and LOd_180, respectively. The transfer gate functions as a multiplier (mixer). When the target phase correction amount corresponding to the trigonometric function value given from the D/A converter 135 is θ, a matrix operation at the analog signal level described below is performed in the phase rotator 14. After the carrier wave signals LOd_0 and LOd_180 are obtained, these signals are orthogonally modulated to obtain the carrier wave signals LOd_90 and LOd_270 (not illustrated).

$$\begin{pmatrix} LOd\_0 \\ LOd\_180 \end{pmatrix} = \begin{pmatrix} \cos\theta & -\sin\theta \\ \sin\theta & \cos\theta \end{pmatrix} \begin{pmatrix} LOm\_0 \\ LOm\_180 \end{pmatrix}$$

The carrier wave signals LOd_0, LOd_90, LOd_180, and LOd_270 whose phase is rotated only by the target phase correction amount by the phase rotator 14 are input to the orthogonal demodulator 30.

(6) Configuration Example of the Low-Pass Filter Unit 20

Next, with reference to FIG. 3, description will be made of a configuration of the low-pass filter unit 20. As illustrated in FIG. 3, the low-pass filter units 21 and 22 have the same configuration. Thus, description will be made only of the configuration of the low-pass filter unit 21 that processes an I signal.

In the low-pass filter unit 21, the differential signals Ip' and Im' to be fed back from the orthogonal demodulator 33 are input to NMOS transistors m44 and m43, respectively. Source terminals of the NMOS transistors m43 and m44 are connected respectively to NMOS transistors m45 and m46 making up a power source when a given bias voltage b4 is applied to the gate terminal. The drain terminal of the NMOS transistor m41 is connected to the gate terminal of the NMOS transistor m43. In the same way, the drain terminal of the NMOS transistor m42 is connected to the gate terminal of the NMOS transistor m44. The source terminals of the NMOS transistor m41 and m42 are grounded.

The gate terminals of the NMOS transistors m41 and m42 are connected to the gate terminals of the PMOS transistors m2 and m3 (see FIG. 4) of the first analog processing unit 11 (not illustrated). That is, the NMOS transistor m41 and the PMOS transistor m2 of the first analog processing unit 11 configure a current mirror circuit, and the NMOS transistor m42 and the PMOS transistor m3 of the first analog processing unit 11 configure another current mirror circuit. In the above-described configurations, the voltages of the differential signals Ip and Im to be input are converted into currents flowing in the NMOS transistors m41 and m42, respectively.

In the low-pass filter unit 21, a first signal line on a feed forward side (the input side of the baseband signals Ip and Im) and a second signal line on a feed back side (the feedback side of the baseband signals Ip' and Im') are connected by the gate terminals of the NMOS transistors m43 and m44, respectively. The NMOS transistors m43 and m44 configure a source follower circuit. The difference signal between the baseband signals Ip and Im and the baseband signals Ip' and Im' are extracted from the source terminals of the NMOS transistors m43 and m44. The extracted difference signals dIp and dIm are input to the orthogonal modulator 41. As illustrated in FIG. 3, a node to which the above-described lines are connected is connected to variable capacitors VC1 and VC2. That is, the variable capacitor VC1 is connected to a given node on the gate terminal side of the NMOS transistor m43, and the variable capacitor VC2 is connected to a given node on the gate terminal side of the NMOS transistor m44.

Figure 8:
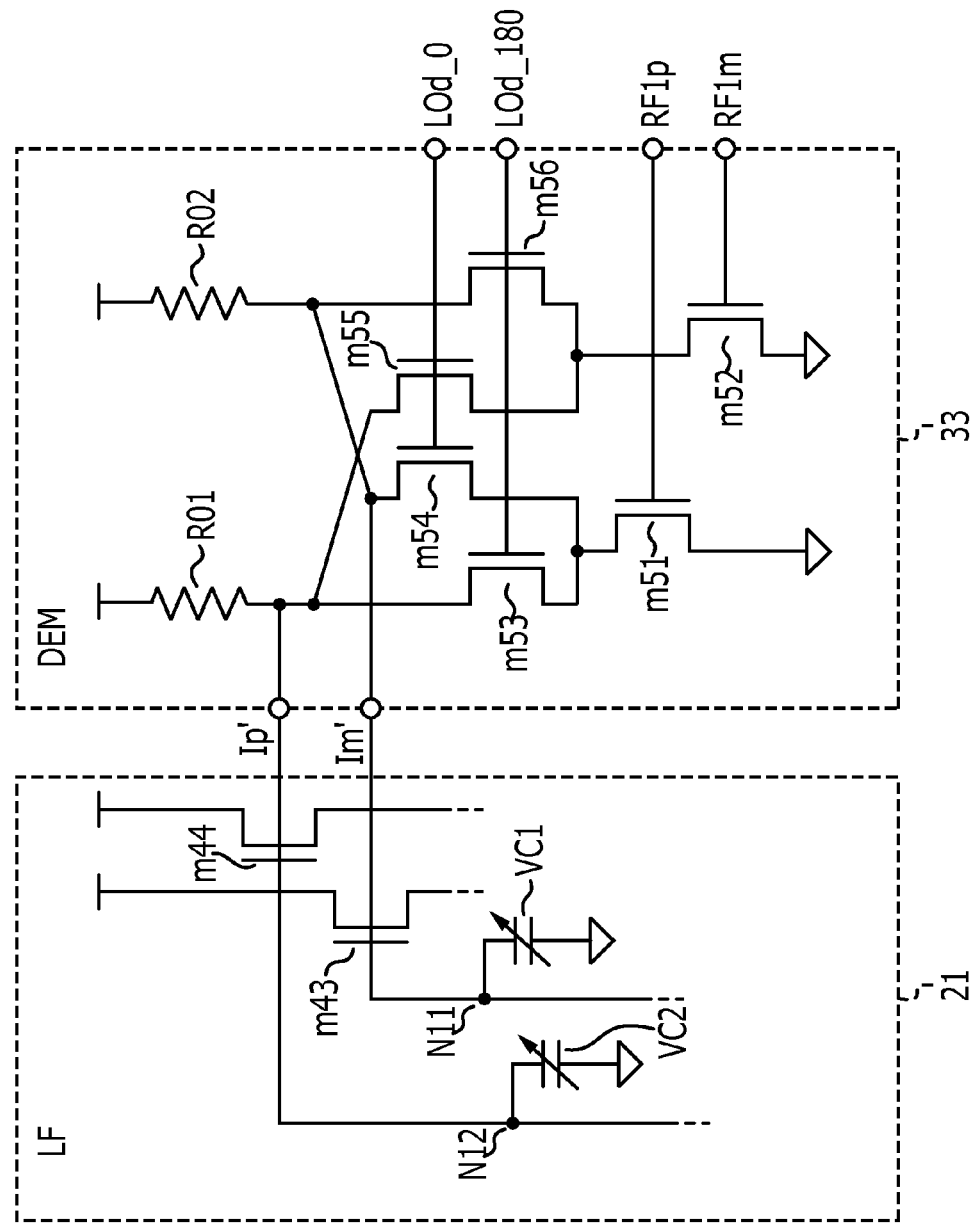
FIG. 8 illustrates an example of a low-pass filter.

With reference to FIG. 8, description will be made of functions of the variable capacitors VC1 and VC2. FIG. 8 is a diagram illustrating a low-pass filter function made up of the low-pass filter unit 21 and the orthogonal demodulator 33. In FIG. 8, the orthogonal demodulator 33 includes MOS transistors m51 to m56 and resistances R01 and R02 and is illustrated as, for example, a Gilbert cell type mixer circuit. When the baseband signals Ip' and Im' are output from the drain terminals of NMOS transistors m55 and m54, respectively, of the orthogonal demodulator 33, the resistances R01 and R02 are connected between power-supply voltage and the drain terminals thereof. The baseband signals Ip' and Im' are applied to the gate terminals of the NMOS transistors m44 and m43, respectively. The difference signals dIp and dIm are extracted from the source terminals of the NMOS transistors m44 and m43 and then input to the orthogonal modulator 41.

In the above-described configuration, the first line on the feed forward side (the input side of the baseband signals Ip and Im) is connected to the second line on the feed back side (the feedback side of the baseband signal Ip' and Im'). A given node on the connected signal line, for example, a node N12 and a node N11 (the first node) illustrated in FIG. 8 are connected to the variable capacitors VC2 and VC1, respectively. A low-pass filter made up of the resistance R01 and the variable capacitor VC2 and another low-pass filter made up of the resistance R02 and the variable capacitor VC1 are applied to the node N12 and the node N11, respectively. Accordingly, the distortion compensating apparatus according to the present embodiment has the configuration in which the feedback system may have a desired filter characteristic (i.e., a desired dominant pole may be set) by adjusting the values of the variable capacitors VC1 and VC2. As the characteristic of the low-pass filter, for example, it is preferable that a gain in a high frequency band with 15 to 30 MHz or more is decreased to 0 dB by allowing the signals to pass through the regions of the baseband (to about 5 MHz), for example. The same characteristic is applied to the Q component.

With reference to FIG. 3, the low-pass filter unit 22 has the same configuration as that of the low-pass filter unit 21 and sends the differential signals dQp and dQm (difference signal) of the Q component to the orthogonal modulator 42.

The distortion compensating apparatus is provided with orthogonal demodulators 31 and 33 and orthogonal demodulators 32 and 34 separately. This is because the filter characteristic is separately adjustable by feedback to the input side and feedback to the phase difference detector 10. The filter characteristic with respect to the feedback to the phase difference detector 10 may be set by integral capacitors C11 to C14 illustrated in FIG. 3.

(7) Operation of the Distortion Compensating Apparatus According to the Embodiment Next, operation of the distortion compensating apparatus according to the embodiment will be described with reference to FIG. 3. In FIG. 3, some of the output signals RF_OUT (single-ended output) of the power amplifier 90 are extracted by the directional coupler 93 and converted into the RF differential signals RF1p and RF1m. The RF differential signals RF1p and RF1m are input to the orthogonal demodulator 30.

Each of the orthogonal demodulators 33 and 34 demodulates the RF signal (the differential signals RF1p and RF1m) extracted from the power amplifier 90 and feeds back the obtained baseband signals to the input side. On the other hand, each of the orthogonal demodulators 31 and 32 demodulates the RF signals (the differential signals RF1p and RF1m) extracted from the power amplifier 90 and sends the obtained baseband signals (the differential signals Qp' and Qm', and the differential signals Ip' and Im') to the phase difference detector 10.

The low-pass filter unit 21 subtracts the I component (Ip', Im') of the baseband signal, which is to be output from the orthogonal demodulator 33, from the I component (Ip, Im) of the baseband signal that is to be input. In the same way, the low-pass filter unit 22 subtracts the Q component (Qp', Qm') of the baseband signal, which is to be output from the orthogonal demodulator 34, from the Q component (Qp, Qm) of the baseband signal that is to be input. The differential signals dIp and dIm of the I component obtained by the subtraction processing by the low-pass filter unit 21 are input to the orthogonal modulator 41. The differential signals dQp and dQm of the Q component obtained by the subtraction processing of the low-pass filter unit 22 are input to the orthogonal modulator 42. Accordingly, a Cartesian Feedback circuit is formed. Here, in the low-pass filter circuit provided in the low-pass filter units 21 and 22, the dominant pole of the Cartesian Feedback circuit may be set to a desired value by adjusting the variable capacitors VC1 and VC2.

The phase correcting apparatus according to the present embodiment is provided to correct a phase change of the feedback system generated by this distortion compensating apparatus. In the phase difference detector 10, the first analog processing unit 11 performs analog multiplication (I×Q') of the I signal (the differential signals Ip, Im) to be input and the Q' signal (the differential signals Qp', Qm') to be fed back by the orthogonal demodulator 32. The second analog processing unit 12 performs analog multiplication (I'×Q) of the I' component (the differential signals Ip', Im') that is to be fed back from the orthogonal demodulator 31 and the Q signal (the differential signals Qp, Qm) that is to be input. Based on the difference of the output between the second analog processing unit 12 and the first analog processing unit 11, that is, the differential signal of (Q×I'−I×Q'), the digital processing unit 13 outputs the phase difference (target phase correction value), as a trigonometric function value (sin, −cos), on the I-Q plane of the baseband signal between the baseband signal that is to be input and the baseband signal that is to be fed back. In this case, the analog signal corresponding to (Q×I'−I×Q') is A/D-converted. Then the trigonometric function value is calculated based on the digital signal. The calculated trigonometric function value is converted into an analog signal and then given to the phase rotator 14.

The phase rotator 14 generates the carrier wave signals (LOd_0, LOd_180) whose phase is rotated only by the target phase correction amount based on the given trigonometric function value. The other carrier wave signals (LOd_90, LOd_270) are generated by further orthogonally modulating the carrier wave signals (LOd_0, LOd_180). The orthogonal demodulators 33 and 34 perform demodulation by the carrier wave signals whose phase is rotated only by the target phase correction amount, so that the phase change of the RF signal occurred in the feedback system is corrected.

As described above, according to the phase correcting apparatus of the present embodiment, the desired analog value (the value corresponding to (Q×I'−I×Q')) that is obtained by multiplying the baseband signal (the first baseband signal) to be input and the baseband signal to be fed back (the second baseband signal) are A/D-converted, and then the trigonometric function value corresponding to the phase difference of the baseband signal is calculated. Therefore, the target phase correction amount may be calculated by the digital processing, so that design of the circuit is made easy. To minimize the quantization error, it is preferable to provide a sigma-delta type A/D converter that processes the above-described desired analog value.

Although the embodiments of the present invention have been described in detail, it should be understood that the various changes, substitutions, and alterations could be made hereto without departing from the spirit and scope of the invention.

For example, in the above-described distortion compensating apparatus according to the embodiment, an example of a case where the phase of the carrier wave signal that is to be given to the orthogonal demodulator 30 is described. However, the target of the phase correction is not limited to this example. The target of the phase correction may be the baseband signal to be input, the baseband signal to be obtained by the orthogonal demodulator 30, or the carrier wave signal given to the orthogonal modulator 40.

In the above-described phase correcting apparatus according to the embodiment, the one-bit sigma-delta type A/D converter is used in the digital processing unit 13. However, the present invention is not limited to the one-bit sigma-delta type A/D converter. A sigma-delta type A/D converter of a plurality of bits may be used. It is obvious that any A/D converter other than the sigma-delta type A/D converter (such as parallel comparison type, pipeline type, or the like) may be used.

According to embodiments described above, designing of circuits may be facilitated due to obtaining of target phase arrangement amount by digital processing.

The specific example referred in the description of the above-described embodiment is an example illustrating the present embodiment. It should be understood that other circuits with similar configurations may be used. According to the above-described embodiments, in the phase correcting apparatus for the radio transmitter which rotates the phase of the baseband signal or the carrier wave signal based on the target phase correction amount, so that design of the circuit is made easy.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A phase correcting apparatus for a radio transmitter, the phase correcting apparatus comprising:
   a demodulator which extracts a feedback signal from a part of a first baseband signal, and extracts a second baseband signal from the feedback signal by a first carrier wave signal;
   a modulator which modulates a difference signal between the first baseband signal and the second baseband signal by a second carrier wave signal and which outputs a second radio signal;
   a power amplifier which amplifies the second radio signal to obtain the first radio signal;
   a phase difference detector which detects a phase difference between the first baseband signal and the second baseband signal; and
   a phase rotator which rotates, by using the phase difference as a target phase correction amount, any phase of the first baseband signal, the second baseband signal, the first carrier wave signal, or the second carrier wave signal as a target phase correction amount,
   wherein the phase difference detector comprises
      a first analog processing circuit which obtains a first analog signal by multiplying an I component of the first baseband signal and a Q component of the second baseband signal,
      a second analog processing circuit which obtains a second analog signal by multiplying a Q component of the first baseband signal and an I component of the second baseband signal, and
      a digital processing circuit which converts a difference between the first analog signal and the second analog signal into digital data, and which detects the phase difference based on the converted digital data.

2. The phase correcting apparatus for the radio transmitter according to claim 1, wherein the digital processing circuit comprises:
   a sigma-delta type analog-to-digital converter which converts the difference between the first analog signal and the second analog
   a counter which multiplies an output bit of the sigma-delta type analog-to-digital converter, and
   a memory which refers to a count value of the counter as an address for a trigonometric function value of a phase angle corresponding to the target phase correction amount.

3. The phase correcting apparatus for the radio transmitter according to claim 1, further comprising:
   a first low-pass filter located at a first node at which a first signal line for transmitting the first baseband signal is connected to a second signal line for transmitting the second baseband signal;
   a second low-pass filter having a filter characteristic which is different to that of the first low-pass filter, wherein
   the demodulator includes a first demodulator and a second demodulator,
   the first low-pass filter is arranged to filter the second baseband signal from the first demodulator,
   the second low-pass filter is arranged to filter the second baseband signal from the second demodulator, and
   the phase correcting apparatus is arranged such that the second baseband signal from the first demodulator is sent to the second signal line, and the second baseband signal from the second demodulator is sent to the phase difference detector.

4. The phase correcting apparatus for the radio transmitter according to claim 3, wherein
   the difference signal is extracted by a source follower circuit comprising a transistor having a gate terminal connected to the first node and a drain terminal connected to power-supply voltage.

* * * * *